(12) United States Patent
Izikson et al.

(10) Patent No.: US 9,606,453 B2
(45) Date of Patent: Mar. 28, 2017

(54) METHOD AND SYSTEM FOR PROVIDING TOOL INDUCED SHIFT USING A SUB-SAMPLING SCHEME

(75) Inventors: Pavel Izikson, Haifa (IL); Guy Cohen, Yaad (IL)

(73) Assignee: KLA-Tencor Corporation, Milpitas, CA (US)

( * ) Notice: Subject to any disclaimer, the term of this patent is extended or adjusted under 35 U.S.C. 154(b) by 1421 days.

(21) Appl. No.: 13/231,333

(22) Filed: Sep. 13, 2011

(65) Prior Publication Data

US 2012/0084041 A1    Apr. 5, 2012

Related U.S. Application Data

(60) Provisional application No. 61/388,427, filed on Sep. 30, 2010.

(51) Int. Cl.
*G01L 25/00* (2006.01)
*G03F 7/20* (2006.01)

(52) U.S. Cl.
CPC ............................ *G03F 7/70616* (2013.01)

(58) Field of Classification Search
CPC .................................................. G03F 7/70616
USPC ........................................................ 702/113
See application file for complete search history.

(56) References Cited

U.S. PATENT DOCUMENTS

| 5,711,843 A | 1/1998 | Jahns |
| 5,719,796 A | 2/1998 | Chen |
| 6,704,661 B1 | 3/2004 | Opsal et al. |
| 6,768,967 B2 | 7/2004 | Johnson et al. |
| 6,867,866 B1 | 3/2005 | Chang et al. |
| 6,898,596 B2 | 5/2005 | Aikens et al. |

(Continued)

FOREIGN PATENT DOCUMENTS

| JP | 09-146285 A | 7/2009 |
| JP | 2010-135370 A | 6/2010 |

(Continued)

OTHER PUBLICATIONS

Stephen Boyd and Leiven Vandenberghe, Convex Optimization, 7th printing, Cambridge University Press, 2009, 730 pages.

*Primary Examiner* — John Breene
*Assistant Examiner* — Stephanie Bloss
(74) *Attorney, Agent, or Firm* — Suiter Swantz pc llo

(57) ABSTRACT

The present invention may include measuring tool induced shift (TIS) on at least one wafer of a lot of wafers via an omniscient sampling process, randomly generating a plurality of sub-sampling schemes, each of the set of randomly generated sub-sampling schemes having the same number of sampled fields, measuring TIS at each location of each of the randomly generated sub-sampling schemes, approximating a set of TIS values for each of the randomly generated sub-sampling schemes utilizing the TIS measurements from each of the randomly generated sub-sampling schemes, wherein each set of TIS values for each of the randomly generated sub-sampling schemes is calculated utilizing an interpolation process configured to approximate a TIS value for each location not included in a randomly generated sub-sampling scheme, and determining a selected sub-sampling scheme by comparing each of the calculated sets of TIS values to the measured TIS of the omniscient sampling process.

23 Claims, 7 Drawing Sheets

(56) References Cited

U.S. PATENT DOCUMENTS

| | | |
|---|---|---|
| 6,919,964 B2 | 7/2005 | Chu |
| 7,069,153 B2 | 6/2006 | Johnson |
| 7,145,664 B2 | 12/2006 | Opsal et al. |
| 7,385,699 B2 | 6/2008 | Mieher et al. |
| 7,433,039 B1 * | 10/2008 | Levinski ............ G03F 7/70616 |
| | | 356/401 |
| 7,473,502 B1 | 1/2009 | Ausschnitt et al. |
| 7,725,208 B2 | 5/2010 | Shanmugasundram et al. |
| 7,873,585 B2 | 1/2011 | Izikson |
| 7,876,438 B2 | 1/2011 | Ghinovker et al. |
| 7,933,026 B2 | 4/2011 | Opsal et al. |
| 8,175,831 B2 | 5/2012 | Izikson et al. |
| 2002/0193899 A1 * | 12/2002 | Shanmugasundram  B24B 37/013 |
| | | 700/108 |
| 2004/0169861 A1 * | 9/2004 | Mieher ................ G01N 21/956 |
| | | 356/400 |
| 2006/0210893 A1 * | 9/2006 | Van Bilsen ......... G03F 7/70633 |
| | | 430/30 |
| 2007/0258074 A1 | 11/2007 | Moest |
| 2008/0286885 A1 | 11/2008 | Izikson et al. |
| 2009/0063378 A1 * | 3/2009 | Izikson ................ G05B 13/027 |
| | | 706/21 |
| 2009/0259605 A1 | 10/2009 | Opsal et al. |

FOREIGN PATENT DOCUMENTS

| | | |
|---|---|---|
| JP | 10-270354 A | 12/2010 |
| WO | 2008131422 A1 | 10/2008 |

\* cited by examiner

700

702 — MEASURING OVERLAY ON AT LEAST ONE WAFER OF A LOT OF WAFERS AT A FIRST WAFER ORIENTATION VIA AN OMNISCIENT SAMPLING PROCESS, WHEREIN THE OMNISCIENT SAMPLING PROCESS INCLUDES MEASURING OVERLAY AT EACH MEASUREMENT LOCATION OF EACH FIELD OF THE AT LEAST ONE WAFER

704 — GENERATING A FIRST SET OF PROCESS TOOL CORRECTABLES UTILIZING ONE OR MORE RESULTS OF THE OVERLAY MEASURED VIA THE OMNISCIENT SAMPLING PROCESS, WHEREIN A PROCESS TOOL CORRECTABLE OF THE FIRST SET OF PROCESS TOOL CORRECTABLES ASSOCIATED WITH AN ANALYZED MEASUREMENT LOCATION OF THE AT LEAST ONE WAFER IS CALCULATED USING THE MEASURED OVERLAY OF ALL MEASUREMENT LOCATIONS OF THE AT LEAST ONE WAFER

706 — GENERATING A SECOND SET OF PROCESS TOOL CORRECTABLES UTILIZING ONE OR MORE RESULTS OF THE OVERLAY MEASURED VIA THE OMNISCIENT SAMPLING PROCESS, WHEREIN A PROCESS TOOL CORRECTABLE OF THE SECOND SET OF PROCESS TOOL CORRECTABLES ASSOCIATED WITH AN ANALYZED MEASUREMENT LOCATION OF THE AT LEAST ONE WAFER IS CALCULATED USING THE MEASURED OVERLAY OF ALL MEASUREMENT LOCATIONS OF THE AT LEAST ONE WAFER EXCEPT FOR THE ANALYZED MEASUREMENT LOCATION

708 — GENERATING A SUB-SAMPLING SCHEME BY COMPARING THE FIRST GENERATED SET OF PROCESS TOOL CORRECTABLES TO THE SECOND GENERATED SET OF PROCESS TOOL CORRECTABLES

710 — MEASURING OVERLAY ON THE AT LEAST ONE WAFER AT A SECOND WAFER ORIENTATION ROTATED 180 DEGREES RELATIVE TO THE FIRST WAFER ORIENTATION AT EACH OF THE MEASUREMENT LOCATIONS OF THE GENERATED SUB-SAMPLING SCHEME

712 — DETERMINING A FIRST SET OF TOOL INDUCED SHIFT (TIS) VALUES FOR THE SET OF SUB-SAMPLING MEASUREMENT LOCATIONS OF THE SUB-SAMPLING SCHEME UTILIZING THE OVERLAY MEASURED AT THE FIRST WAFER ORIENTATION AND THE OVERLAY MEASURED AT THE SECOND WAFER ORIENTATION ROTATED 180 DEGREES RELATIVE TO THE FIRST WAFER ORIENTATION

714 — DETERMINING A SECOND SET OF TIS VALUES BY APPROXIMATING TIS FOR EACH OF A SET OF LOCATIONS OF THE AT LEAST ONE WAFER NOT INCLUDED IN THE GENERATED SUB-SAMPLING SCHEME UTILIZING AN INTERPOLATION PROCESS

FIG.7

METHOD AND SYSTEM FOR PROVIDING TOOL INDUCED SHIFT USING A SUB-SAMPLING SCHEME

CROSS-REFERENCE TO RELATED APPLICATION

The present application is related to and claims the benefit of the earliest available effective filing date(s) from the following listed application(s) (the "Related Applications") (e.g., claims earliest available priority dates for other than provisional patent applications or claims benefits under 35 USC §119(e) for provisional patent applications, for any and all parent, grandparent, great-grandparent, etc. applications of the Related Application(s)).

Related Applications

For purposes of the USPTO extra-statutory requirements, the present application constitutes a regular (non-provisional) patent application of United States Provisional Patent Application entitled METHOD TO REDUCE NUMBER OF MEASUREMENT POINTS USED FOR TIS CORRECTION, naming Pavel Izikson as inventor, filed Sep. 30, 2010, Application Ser. No. 61/388,427.

TECHNICAL FIELD

The present invention generally relates to a method and system for providing tool induced shift (TIS) values across a semiconductor surface, and, in particular, a method and system for generating and carrying out a TIS sub-sampling scheme of a semiconductor wafer in concert with an interpolation process.

BACKGROUND

As the dimensions of semiconductor devices and components continue to decrease, the need for increased alignment control between various layers or features within a single layer of a given sample will continue to increase. In the context of semiconductor processing, semiconductor-based devices may be produced by fabricating a series of layers on a substrate, some or all of the layers including various structures. The relative position of these structures both within a single layer and with respect to structures in other layers is critical to the performance of the devices. Examples of semiconductor fabrication processes include, but are not limited to, chemical-mechanical polishing (CMP), etching, deposition, and ion implantation. Multiple semiconductor devices may be fabricated in an arrangement on a single semiconductor wafer and then separated into individual semiconductor devices.

Metrology processes are used at various steps during a semiconductor manufacturing process to monitor and control one or more semiconductor layer processes. For example, metrology processes are used to measure one or more characteristics of a wafer such as dimension (e.g., line width, thickness, etc.) of features formed on the wafer during a process step, wherein the quality of the process step can be determined by measuring the one or more characteristics. One such characteristic includes overlay error.

An overlay measurement generally specifies how accurately a first patterned layer aligns with respect to a second patterned layer disposed above or below it or how accurately a first pattern aligns with respect to a second pattern disposed on the same layer. The overlay error is typically determined with an overlay target having structures formed on one or more layers of a work piece (e.g., semiconductor wafer). If the layers or patterns of a given semiconductor device are not properly formed, then the structure on one layer or pattern tends to be offset or misaligned relative to the structure on the other layer or pattern. The misalignment between any of the patterns used at different stages of semiconductor integrated circuit manufacturing is known as 'overlay error.'

Moreover, if a measured characteristic, such as overlay error, of the wafer is unacceptable (e.g., out of a predetermined range for the characteristic), the measurement of the one or more characteristics may be used to alter one or more parameters of the process such that additional wafers manufactured by the process have acceptable characteristics.

In the case of overlay error, an overlay measurement may be used to correct a lithography process in order to keep overlay errors within desired limits. For example, overlay measurements may be fed into an analysis routine that calculates "correctables" and other statistics, which may be used by the operator in order to better align the lithography tool used in the wafer processing.

In a general sense, metrology applications, such as overlay measurements, require high quality optics in order to satisfy the requirements of advanced lithography processes. In the case of overlay metrology, optical imperfections (e.g., aberrations) in the optical components of an implementing system may result in Tool Induced Shift (TIS). In this manner, optical imperfections in an optical system may cause a shift in the measured overlay relative to the actual overlay. For example, optical aberrations present in an optical column of a metrology may lead to TIS. The standard measurement of TIS involves measuring overlay at first position and then rotating the wafer by 180 degrees and repeating the overlay measurement.

There are, however, a number of disadvantages to using metrology processes and tools to measure one or more characteristics of a wafer for process monitoring and control applications. For example, most metrology tools are relatively slow, particularly compared to inspection systems. Therefore, metrology processes are often performed at one location or a limited number of locations on the wafer such that metrology results may be acquired in a relatively expedient manner. However, many processes used to manufacture semiconductor devices produce wafers that have characteristic(s) that vary across the surface of the wafers. As such, using metrology measurements performed at one location or a limited number of locations on a wafer may not provide sufficient information about the characteristic(s) of the wafers such that the process can be accurately monitored and controlled. Therefore, the sampling plan of the metrology process can significantly affect the meaningfulness and usefulness of the metrology results.

In a practical sense, all optical metrology systems generate tool induced shift to some degree. As such, TIS must be corrected for during semiconductor device fabrication processing, resulting in increased processing times and cost. These inefficiencies are compounded by the fact that a single TIS measurement requires two overlay measurements, a first overlay measurement at zero degree wafer orientation and a second overlay measurement at 180 degree wafer orientation.

Accordingly, it may be desirable to provide a method and/or system which provides a more efficient TIS sampling scheme, allowing for fewer measurements of a selected wafer, while mitigating the loss of measurement information by utilizing an approximation method to provide adequate TIS information for unmeasured sampling locations.

SUMMARY

A method for providing tool induced shift values across a semiconductor surface is disclosed. In one aspect, the method may include, but is not limited to, measuring tool induced shift (TIS) on at least one wafer of a lot of wafers via an omniscient sampling process, wherein the omniscient sampling process includes measuring TIS at each measurement location of each field of the at least one wafer; randomly generating a plurality of sub-sampling schemes, wherein the number of fields to be sampled in each of the sub-sampling schemes is preselected, each of the set of randomly generated sub-sampling schemes having the same number of sampled fields, the number of sub-sampling schemes being preselected; measuring TIS at each location of each of the randomly generated sub-sampling schemes; approximating a set of TIS values for each of the randomly generated sub-sampling schemes utilizing the TIS measurements from each of the randomly generated sub-sampling schemes, wherein each set of TIS values for each of the randomly generated sub-sampling schemes is calculated utilizing an interpolation process configured to approximate a TIS value for each location not included in a randomly generated sub-sampling scheme utilizing the TIS measured at each location of the randomly generated sub-sampling scheme; and determining a selected sub-sampling scheme by comparing each of the calculated sets of TIS values to the measured TIS of the omniscient sampling process, wherein the sub-sampling scheme includes a set of measurement locations of the at least one wafer.

In another aspect, a method may include, but is not limited to, generating a tool induced shift (TIS) sub-sampling scheme, wherein the TIS sub-sampling scheme is defined utilizing one or more statistical criterion, a selected number of sampling locations and a selected model type for TIS dependence across a semiconductor wafer surface, wherein the TIS sub-sampling scheme includes a set of measurement locations of the semiconductor wafer; determining a first set of TIS values by measuring TIS at each of the measurement locations of the generated TIS sub-sampling scheme; and determining a second set of TIS values by approximating TIS for each of a set of locations not included in the generated TIS sub-sampling scheme utilizing an interpolation process, wherein the interpolation process utilizes the first set of TIS values in order to calculate an approximated TIS value for each of the set of locations not included in the generated TIS sub-sampling scheme.

In another aspect, a method may include, but is not limited to, measuring overlay on at least one wafer of a lot of wafers at a first wafer orientation via an omniscient sampling process, wherein the omniscient sampling process includes measuring overlay at each measurement location of each field of the at least one wafer; generating a sub-sampling scheme by identifying a set of measurement locations having an overlay value between a first overlay value and a second overlay value, wherein the sub-sampling scheme includes a set of measurement locations of the at least one wafer; measuring overlay on the at least one wafer at a second wafer orientation rotated 180 degrees relative to the first wafer orientation at each of the measurement locations of the sub-sampling scheme; determining a first set of tool induced shift (TIS) values for the set of measurement locations of the sub-sampling scheme utilizing the overlay measured at the first wafer orientation and the overlay measured at the second wafer orientation rotated 180 degrees relative to the first wafer orientation; and determining a second set of TIS values by approximating TIS for each of a set of measurement locations of the at least one wafer not included in the generated sub-sampling scheme utilizing an interpolation process, wherein the interpolation process utilizes the first set of TIS values in order to calculate an approximated TIS value for each of the set of locations not included in the generated TIS sub-sampling scheme.

In another aspect, a method may include, but is not limited to, measuring overlay on at least one wafer of a lot of wafers at a first wafer orientation via an omniscient sampling process, wherein the omniscient sampling process includes measuring overlay at each measurement location of each field of the at least one wafer; generating a first set of process tool correctables utilizing one or more results of the overlay measured via the omniscient sampling process, wherein the first set of process tool correctables includes a process tool correctable calculated for each measurement location of each field of the at least one wafer, wherein a process tool correctable of the first set of process tool correctables associated with an analyzed measurement location of the at least one wafer is calculated using the measured overlay of all measurement locations of the at least one wafer; generating a second set of process tool correctables utilizing one or more results of the overlay measured via the omniscient sampling process, wherein the second set of process tool correctables includes a process tool correctable calculated for each measurement location of each field of the at least one wafer, wherein a process tool correctable of the second set of process tool correctables associated with an analyzed measurement location of the at least one wafer is calculated using the measured overlay of all measurement locations of the at least one wafer except for the analyzed measurement location; generating a sub-sampling scheme by comparing the first generated set of process tool correctables to the second generated set of process tool correctables, wherein the sub-sampling scheme includes a set of measurement locations, wherein the set of measurement locations of the sub-sampling scheme includes a selected number of sub-sampling measurement locations, wherein the selected number of measurement locations of the at least one wafer having the largest difference between the first generated set of process tool correctables and the second generated set of process tool correctables form the set of measurement locations of the sub-sampling scheme; measuring overlay on the at least one wafer at a second wafer orientation rotated 180 degrees relative to the first wafer orientation at each of the measurement locations of the generated sub-sampling scheme; determining a first set of tool induced shift (TIS) values for the set of sub-sampling measurement locations of the sub-sampling scheme utilizing the overlay measured at the first wafer orientation and the overlay measured at the second wafer orientation rotated 180 degrees relative to the first wafer orientation; and determining a second set of TIS values by approximating TIS for each of a set of locations of the at least one wafer not included in the generated sub-sampling scheme utilizing an interpolation process, wherein the interpolation process utilizes the first set of TIS values in order to calculate an approximated TIS value for each of the set of locations not included in the generated TIS sub-sampling scheme.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF THE DRAWINGS

The numerous advantages of the disclosure may be better understood by those skilled in the art by reference to the accompanying figures in which:

FIG. 7 is a flow diagram illustrating a method for providing tool induced shift values across a semiconductor surface, in accordance with one embodiment of the present invention.

DETAILED DESCRIPTION OF THE INVENTION

Figure 1B:
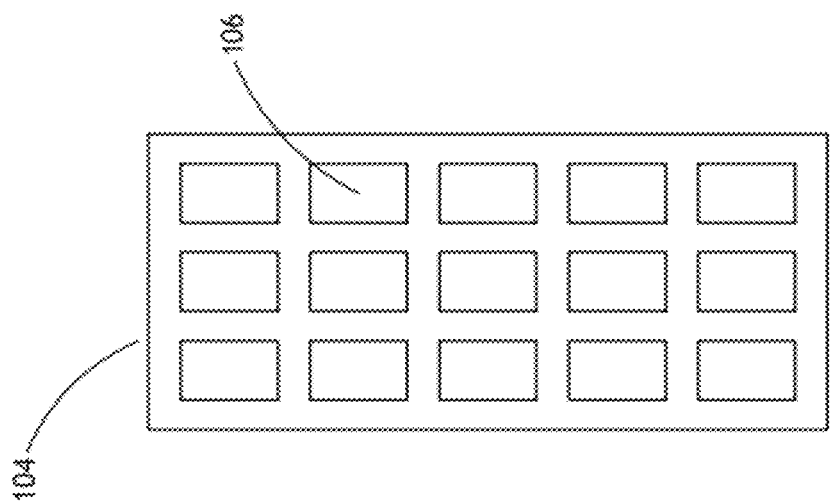
FIG. 1B illustrates a top plan view of an individual field of a semiconductor wafer showing a plurality of targets within the field.

Reference will now be made in detail to the subject matter disclosed, which is illustrated in the accompanying drawings.

Referring generally to FIGS. 1A through 7, a method and system for providing tool induced shift values across a semiconductor surface is described in accordance with the present disclosure. Employing a tool induced shift (TIS) sub-sampling scheme combined with one or more interpolation processes may improve semiconductor wafer TIS determination and subsequent process tool correction. Conventionally, overlay metrology, utilized to determine TIS, is carried out at fixed locations of a semiconductor wafer. The present invention is directed at a method and system for providing tool induced shift values across a semiconductor surface utilizing a sub-sampling scheme (e.g., optimized, enhanced, or reduced metrology sampling scheme) in concert with an interpolation process (e.g., wavelet analysis, Spline interpolation, polynomial interpolation, or neural network interpolation). The interpolation process allows for the approximation of TIS at unmeasured fields of a tested semiconductor wafer. The combination of fewer measurement locations, due to the sub-sampling scheme, along with the interpolation process, allows a user to gather acceptably accurate TIS information more efficiently, thereby increasing throughput of a semiconductor fabrication process.

As used throughout the present disclosure, the term "wafer" generally refers to a substrate formed of a semiconductor or non-semiconductor material. For example, a semiconductor or non-semiconductor material may include, but is not limited to, monocrystalline silicon, gallium arsenide, and indium phosphide. A wafer may include one or more layers. For example, such layers may include, but are not limited to, a resist, a dielectric material, a conductive material, and a semiconductive material. Many different types of such layers are known in the art, and the term wafer as used herein is intended to encompass a wafer on which all types of such layers may be formed.

A typical semiconductor process includes wafer processing by lot. As used herein a "lot" is a group of wafers (e.g., group of 25 wafers) which are processed together. Each wafer in the lot is comprised of many exposure fields from the lithography processing tools (e.g. steppers, scanners, etc.). Within each field may exist multiple die. A die is the functional unit which eventually becomes a single chip. On product wafers, overlay metrology marks are typically placed in the scribeline area (for example in the 4 corners of the field). This is a region that is typically free of circuitry around the perimeter of the exposure field (and outside the die). In some instances, overlay targets are placed in the streets, which are regions between the die but not at the perimeter of the field. It is fairly rare for overlay targets to be placed on product wafers within the prime die areas, as this area is critically needed for circuitry. Engineering and characterization wafers (not production wafers), however, typically have many overlay targets throughout the center of the field where no such limitations are involved. Because of the spatial separation between the "scribe-line" metrology marks and the prime die circuitry, there occur discrepancies between what is measured and what needs to be optimized on product wafers. Advances in both the scribe-line metrology marks and in their interpretation are required.

One or more layers formed on a wafer may be patterned or unpatterned. For example, a wafer may include a plurality of dies, each having repeatable patterned features. Formation and processing of such layers of material may ultimately result in completed devices. Many different types of devices may be formed on a wafer, and the term wafer as used herein is intended to encompass a wafer on which any type of device known in the art is being fabricated.

Figure 2:
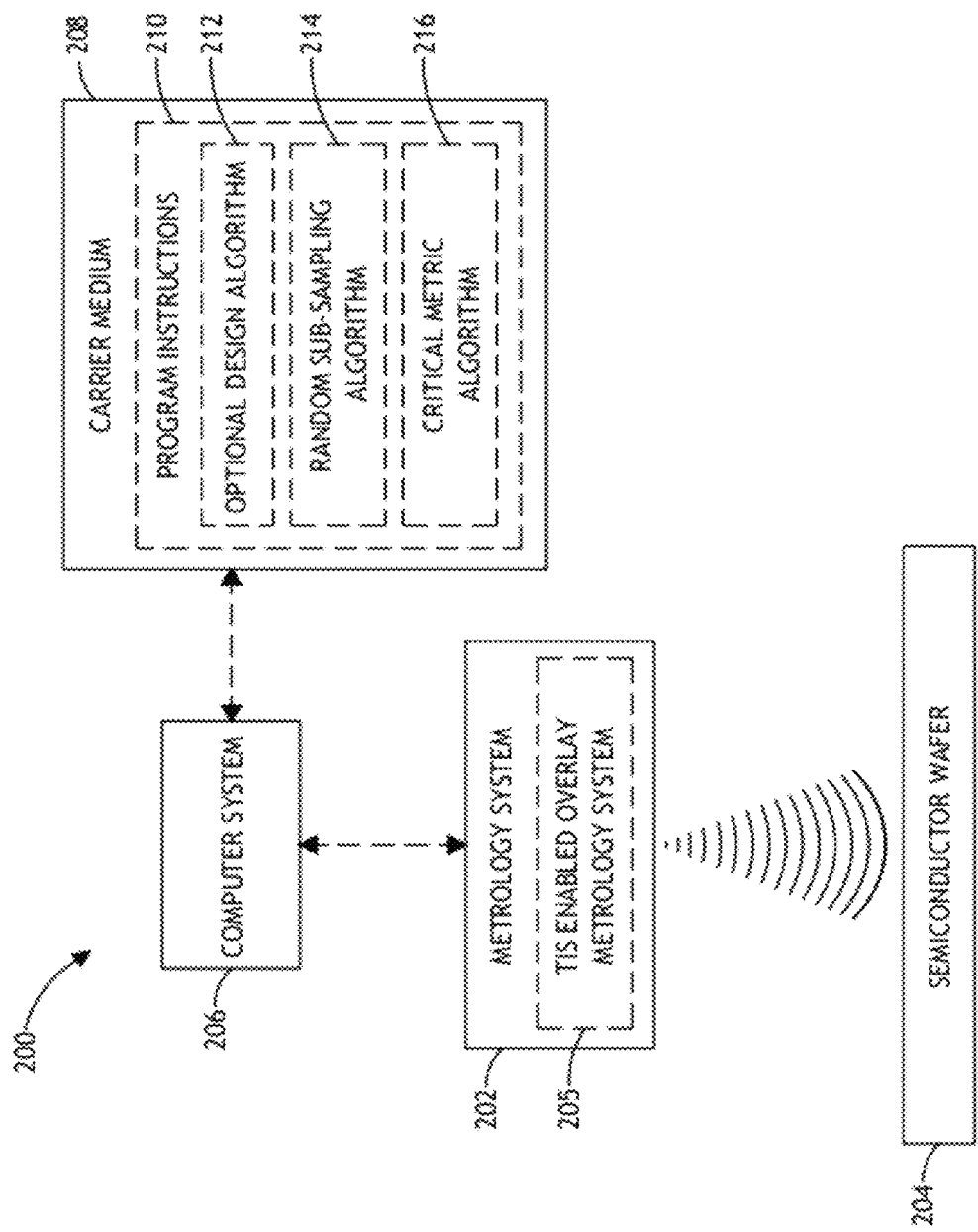
FIG. 2 is a block diagram illustrating a system for providing tool induced shift values across a semiconductor surface, in accordance with one embodiment of the present invention.

FIG. 2 illustrates a system 200 for providing tool induced shift (TIS) values across a semiconductor surface using a sub-sampling scheme with smart interpolation. In one embodiment, the system 200 may include a metrology system 202, such as a metrology system configured to perform overlay metrology or CD metrology at identified locations of the semiconductor wafer. The metrology system 202 may include any appropriate metrology system known in the art. For example, the metrology system 202 may include a metrology system 205 configured to perform tool induced shift (TIS) measurements of a semiconductor wafer 204. TIS may be defined as:

$$TIS = \frac{1}{2}[OVL(180°) + OVL(0°)] \quad \text{(Eq. 1)}$$

where OVL(0°) represents the overlay measured at a first position and OVL(180°) is the measured overlay following 180 degree rotation of the sample relative to the first position.

In this sense, the metrology system 205 may be configured to measure overlay error of a set of measurement locations of the wafer 204. Then, upon rotation of the wafer

204 by 180 degrees, the metrology system 205 may again measure overlay error at the same set of measurement locations. The overlay measurements may be transmitted to the computer system 206 and TIS may be calculated utilizing an algorithm consistent with Equation 1 above.

In a further embodiment, the metrology system 202 may be configured to accept instructions from another subsystem of the system 200 in order to carry out a designated metrology plan. For instance, the metrology system 202 may accept instructions from one or more computer systems 206 of the system 200. Upon receiving the instructions from the computer system 206, the metrology system 202 may perform overlay metrology at various locations of the semiconductor wafer 204 identified in the provided instructions. As will be discussed in greater detail further herein, the instructions provided by the computer system 206 may include a sub-sampling scheme, which may be inputted into the metrology tool 202 (e.g., metrology tool 205) in order to measure TIS of a selected sub-set of the available measurement locations on a semiconductor wafer 204.

In one aspect, one or more computer systems 206 of the system 200 may be configured to generate a sub-sampling scheme based on an optimal sampling scheme determined utilizing a user inputted number of measurement locations, a user inputted model (e.g., polynomial based model) for TIS across the wafer 204, and a selected optimal criteria (e.g., A-optimality, B-optimality, D-optimality, and the like).

In one embodiment, the one or more computer systems 206 may be configured to receive a user selected number of sub-sampling locations and a user selected TIS model type entered via a user interface (not shown) of the system 200. The one or more computer systems 206 may further be configured to calculate a TIS sub-sampling scheme using an optimal design algorithm 212. In this sense, the optimal design algorithm 212 utilizes the the entered number of sampling locations and the TIS model type to determine the sub-sampling scheme which is optimized with respect to a selected set of statistical criterion (e.g., A-optimality, B-optimality, D-optimality, and the like).

In another aspect, one or more computer systems 206 of the system 200 may be configured to generate a sub-sampling scheme based on an analysis of an omniscient sampling of a test wafer of a first lot. In one embodiment, the one or more computer systems 206 may be configured to receive a set of measurements performed by the metrology system 202 (e.g., metrology system 205) in an omniscient sampling process of one or more wafers of a test lot. The one or more computer systems 206 may further be configured to calculate a set of TIS values using the received measurements from an omniscient sampling process. The one or more computer systems 206 may be configured to randomly generate multiple sets of measurement locations (e.g., across wafer, across individual fields, or both) of a wafer using a random sub-sampling algorithm 214, wherein a user inputs the size of each sub-sampling scheme (i.e., number of measurement locations of each scheme) and the number of sub-sampling schemes. Using these randomly selected locations, the computer system 206 may then calculate multiple modeled sets of TIS across an entire wafer and/or field by inputting measured TIS values taken from the locations of each of the multiple TIS sub-sampling schemes into an interpolation algorithm. The interpolation algorithm may then approximate the TIS across the wafer and/or fields of the wafer which are not included in the randomly selected set of sampling locations of each of the sub-sampling schemes. Then, the modeled sets of TIS (i.e., the interpolated and the values taken from the random location selection) may be used by the computer system 206 to compare to the set of TIS values obtained in the omniscient sampling process. The computer system 206 may then determine a preferred sub-sampling scheme by determining which of the sub-sampling schemes best minimizes the difference between the modeled TIS and the measured TIS obtained via omniscient sampling. In another embodiment, the computer system 206 may determine a sub-sampling scheme by determining which of the sub-sampling schemes reduces the difference between the modeled TIS and the measured TIS obtained via omniscient sampling below a selected threshold level.

In another aspect, one or more computer systems 206 of the system 200 may be configured to generate a sub-sampling scheme by identifying a set of measurement locations having an overlay value at a first rotational orientation (i.e., zero degrees) between a first overlay value and a second overlay value using the critical metric 216 algorithm. In one embodiment, the system 200 may identify the N measurement locations displaying the largest overlay values. In another embodiment, the system 200 may identify the N measurement locations displaying the smallest overlay values. In an additional embodiment, the system 200 may identify the N measurement locations displaying overlay values between a first overlay level and a second overlay level. The system 200 may then use the identified sub-sampling scheme to measure overlay at 180 degrees at each of the positions of the sub-sampling scheme. The computer system 206 may then calculate the TIS for each of the measurement locations of the sub-sampling scheme. Further, utilizing a pre-programmed algorithm, TIS for measurement locations not included in the sub-sampling scheme may be approximated via one or more interpolation processes carried out by the one or more computer systems 206 of the system 200.

In another aspect, one or more computer systems 206 of the system 200 may be configured to generate a sub-sampling scheme by identifying a set of measurement locations having the largest impact on a set of process tool correctables using the critical metric 216 algorithm. The system 200 may then use the identified sub-sampling scheme to measure overlay at 180 degrees at each of the positions of the sub-sampling scheme. The computer system 206 may then calculate the TIS for each of the measurement locations of the sub-sampling scheme. Further, utilizing a pre-programmed algorithm, TIS for measurement locations not included in the sub-sampling scheme may be approximated via one or more interpolation processes carried out by the one or more computer systems 206 of the system 200.

It should be recognized that the various steps described throughout the present disclosure may be carried out by a single computer system 206 or, alternatively, a multiple computer system 206. Moreover, different subsystems of the system 200, such as the metrology system 202, may include a computer system suitable for carrying out at least a portion of the steps described above. Therefore, the above description should not be interpreted as a limitation on the present invention but merely an illustration. Further, the one or more computer systems 206 may be configured to perform any other step(s) of any of the method embodiments described herein.

In another embodiment, the one or more computer systems 206 may then transmit instructions to the measurement system 202 (e.g., metrology system 205) which are indicative of a generated sub-sampling scheme, such as those described above. Moreover, the computer system 206 may be configured to generate the sampling scheme according to any of the embodiments described herein.

In another embodiment, the one or more computer systems 206 may transmit instructions to one or more process tools which are indicative of a set of process tool correctables based on the measured overlay and TIS. Further, the transmitted instructions may contain information indicative of overlay, focus, and dose correctables. Moreover, the one or more computer systems 206 may be configured to perform any other step(s) of any of the method embodiments described herein.

In another embodiment, the computer system 206 may be communicatively coupled to the metrology system 202 or another process tool in any manner known in the art. For example, the one or more computer systems 206 may be coupled to a computer system of a metrology system 202 (e.g., computer system of a metrology system 205) or to a computer system of a process tool. In another example, the metrology system 202 and another process tool may be controlled by a single computer system. In this manner, the computer system 206 of the system 200 may be coupled to a single metrology-process tool computer system. Moreover, the computer system 206 of the system 200 may be configured to receive and/or acquire data or information from other systems (e.g., inspection results from an inspection system, metrology results from a metrology system, or process tool correctables calculated from a system, such as KLA-Tencors KT Analyzer) by a transmission medium that may include wireline and/or wireless portions. In this manner, the transmission medium may serve as a data link between the computer system 206 and other subsystems of the system 200. Moreover, the computer system 206 may send data to external systems via a transmission medium. For instance, the computer system 206 may send a generated sub-sampling scheme or set of process tool correctables to a separate metrology system, which exists independently of the described system 200.

The computer system 206 may include, but is not limited to, a personal computer system, mainframe computer system, workstation, image computer, parallel processor, or any other device known in the art. In general, the term "computer system" may be broadly defined to encompass any device having one or more processors, which execute instructions from a memory medium A method and system for generating and providing an optimized sampling scheme using overlay measurements in the context of a computer system is described generally in U.S. patent application Ser. No. 12/107,346, filed on Apr. 22, 2008, and is incorporated herein by reference.

Program instructions 210 implementing methods such as those described herein may be transmitted over or stored on carrier medium 208.

The carrier medium may be a transmission medium such as a wire, cable, or wireless transmission link. The carrier medium may also include a storage medium such as a read-only memory, a random access memory, a magnetic or optical disk, or a magnetic tape.

The embodiments of the system 200 illustrated in FIG. 2 may be further configured as described herein. In addition, the system 200 may be configured to perform any other step(s) of any of the method embodiment(s) described herein.

Figure 3:
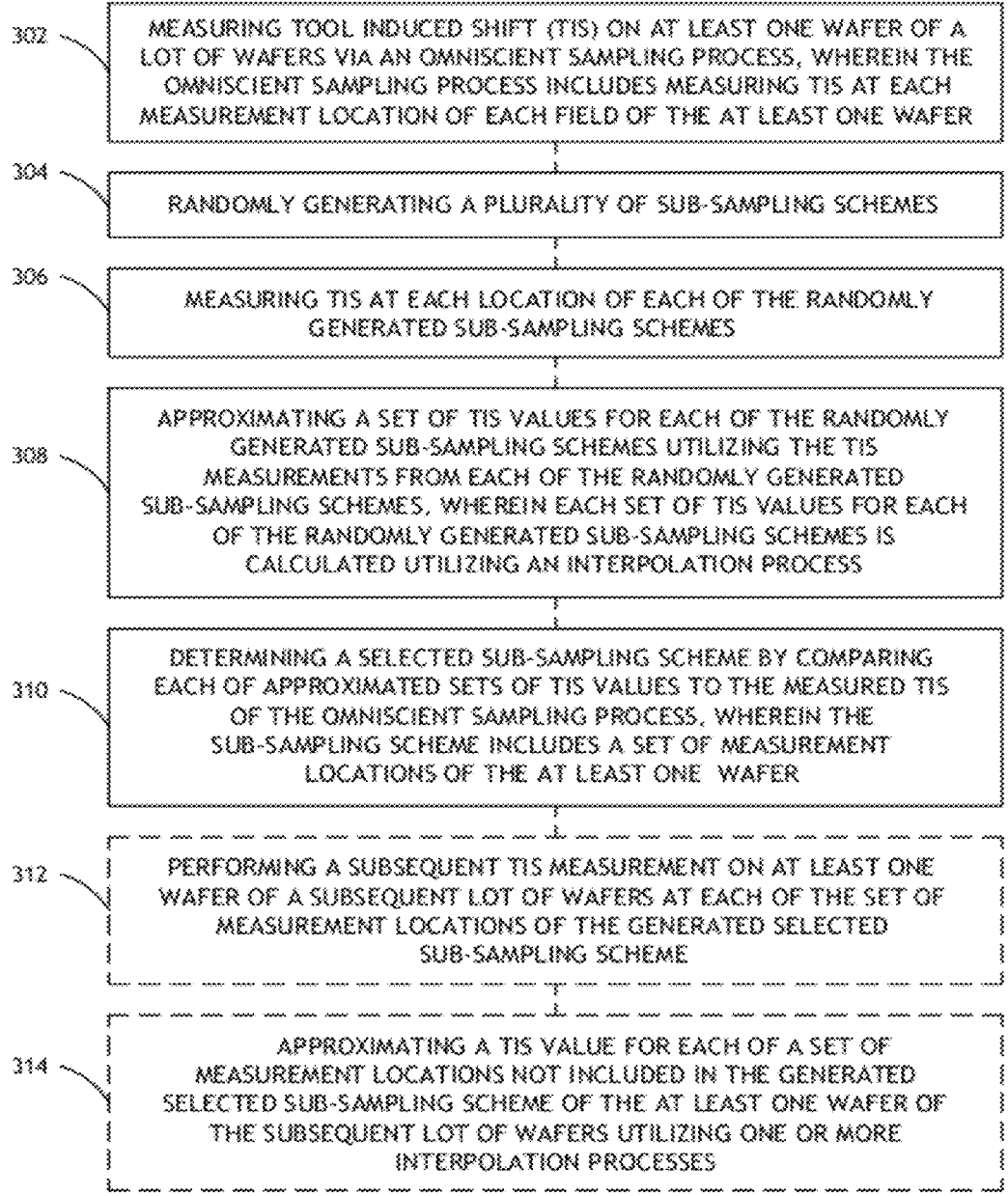
FIG. 3 is a flow diagram illustrating a method for providing tool induced shift values across a semiconductor surface, in accordance with one embodiment of the present invention.

FIG. 3 is a flow diagram illustrating steps performed in a method for providing tool induced values across a semiconductor surface using a sub-sampling sampling scheme with smart interpolation. In one aspect, it is recognized that data processing steps of the process flow 300 may be carried out via a pre-programmed algorithm executed by one or more processors of computer system 206. It should, however, be recognized by those skilled in the art, that the system 200 should not be interpreted as a limitation on process 300 as it is contemplated that a variety of system configurations may carry out process flow 300.

In a first step 302, a first tool induced shift (TIS) measurement may be performed on at least a first wafer of a first lot of wafers using an omniscient sampling process. The omniscient sampling process may include measuring one or more TIS values at each measurement location of the first wafer of the lot of wafers. For example, the omniscient sampling process may include measuring TIS (e.g., measuring overlay at 0 degree and 180 degrees and calculating TIS) at each measurement location of each field of the first wafer of the first lot of wafers.

Figure 1A:
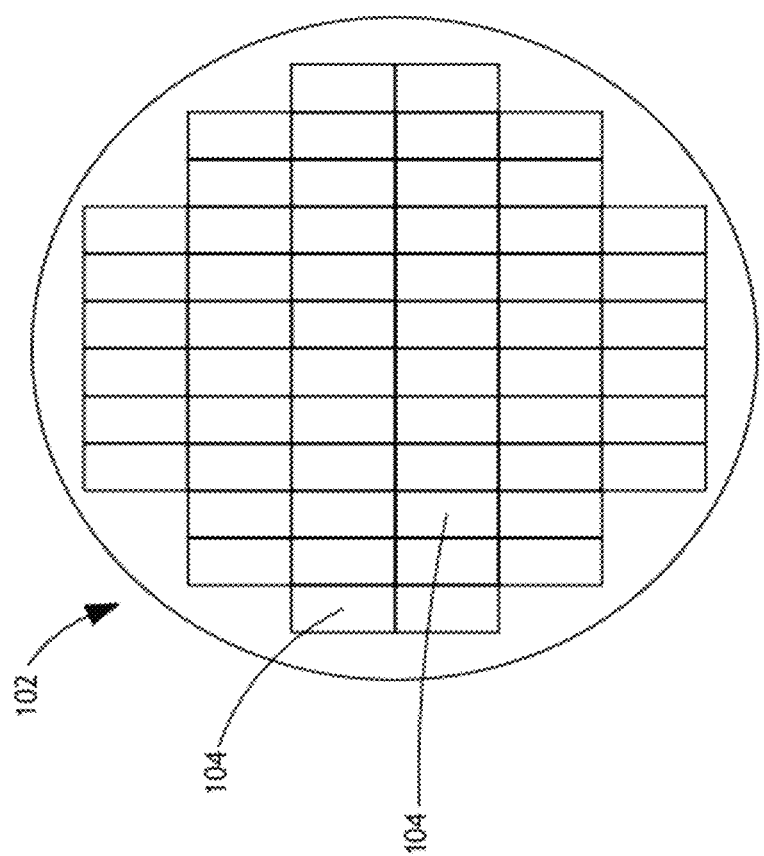
FIG. 1A illustrates a top plan view of a semiconductor wafer with demarked fields.

The method includes performing TIS measurements on one or more wafers in a lot of wafers at all measurement spots on the one or more wafers. This step is referred to herein as "omniscient sampling." As shown in FIG. 1A, in one embodiment, all of the measurement spots include all fields 104 on one or more wafers 102. For example, as shown in FIG. 1A, wafer 102 has multiple fields 104 formed thereon. Although a particular number and arrangement of fields 104 on wafer 102 are shown in FIG. 1A, the number and arrangement of fields on the wafer may vary depending on, for example, the device being formed on the wafers. The measurements may be performed at all of fields 104 formed on wafer 102 and at all of the fields on other wafers in at least one lot. For example, the measurements may be performed at least once per field formed on all of the wafers in at least one lot. The measurements may be performed on device structures formed in the fields and/or on test structures formed in the fields. In addition, the measurements performed in each of the fields may include all of the measurements performed during the metrology process (e.g., one or more different measurements).

In another embodiment, all of the measurement spots measured in an omniscient sampling process may include all targets on one or more wafers in at least one lot. For example, as shown in FIG. 1A, field 104 formed on a wafer 102 may include targets 106. Although a particular number and arrangement of targets 106 in field 104 are shown in FIG. 1B, the number and arrangement of targets 106 in the fields 104 may vary depending on, for example, the devices formed on the wafer 102. Targets 106 may include device structures and/or test structures. In this embodiment, therefore, the measurements may be performed on all targets 106 formed in each field 104. In addition, the measurements may be performed at least once per target formed in field 104. The measurements may also include all of the measurements that are performed during the metrology process (e.g., one or more different measurements). It should be recognized by those skilled in the art that the targets 106 and the fields 104 of FIGS. 1A and 1B are not depicted to scale, as the fields and targets are enlarged relative to the wafer 102 for purposes of clarification.

In another embodiment, all of the measurement spots include all fields and all targets on the wafers in at least one lot. For example, each of fields 104 shown formed on wafer 102 in FIG. 1A may include one or more targets such as targets 106 shown in FIG. 1B. Therefore, the measurements may be performed on each of the targets 106 in each of the fields 104 formed on each of the wafers 102 in at least one lot.

In a second step 304, multiple sub-sampling schemes may be randomly generated. In one aspect, the number (N) of sampling locations in each of the sub-sampling schemes may be preselected by a user, whereas the locations of those sampling locations may be randomly generated. In one embodiment, the sampling locations (e.g., locations within wafer or locations within each field of the wafer) of the multiple sub-sampling schemes may be randomly generated via a Monte Carlo simulation process. In another embodiment, the number of sampling locations to be sampled in the sub-sampling schemes may be preselected to reside within a range of sub-sample locations. For example, a user may select the minimum and/or maximum number of sampling locations to be sampled. Then, after selection of the number of sampling locations or the range of sampling locations, an associated computer system may randomly select the positions of the sub-sampling locations of each of the sub-sampling schemes. In a further embodiment, a computer system may randomly select multiple sets of fields and measurement locations within the selected fields to be analyzed in the subsequent process step. In another aspect, the number (M) of randomly generated sub-sampling schemes may be preselected by a user. For instance, a user may preselect to generate 1000 randomly generated sub-sampling schemes.

Figure 4:
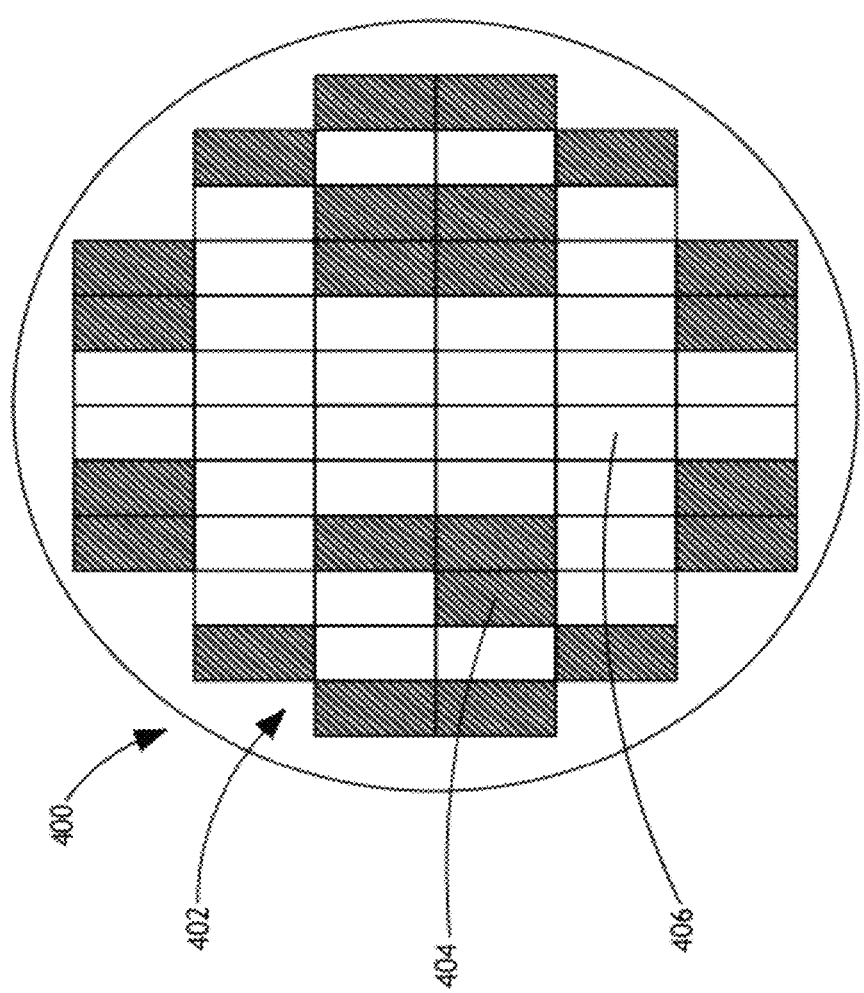
FIG. 4 illustrates an exemplary sub-sampling scheme suitable for implementation in the present invention.

In one embodiment, each of the sub-sampling schemes may include a sub-set of the total number of fields of the wafer. For example, as illustrated in FIG. 4, a sub-sampling scheme 402 may include a sub-set of fields 404 of the total number of fields 406 of the wafer 400. With respect to FIG. 4, the shaded regions 404 represent fields included in the sub-sampling scheme, while non-shaded regions 406 represent fields not to be sampled in subsequent lots. As such, the sub-sampling scheme may include fewer to-be sampled fields than the total number of fields of a given wafer. In another embodiment, the sub-sampling scheme may include a sub-set of the total number of measurement spots (e.g., overlay targets) with a single field of the wafer.

In another embodiment, a user may select an additional constraint. For example, the pattern formed by the locations of the sampling locations of the randomly generated sub-sampling schemes may be required to have a selected spatial symmetry, such as 180° or 90° rotational symmetry.

In a third step 306, TIS may be measured at each location of each of the randomly generated sub-sampling schemes generated in step 304. It should be noted that the measurement process used to characterize the TIS associated with the measurement locations of the randomly generated sub-sampling scheme is described in the omniscient sampling step of 302.

In a fourth step 308, a set of TIS values for locations of each of the randomly generated sub-sampling schemes not included in the sub-sampling schemes may be generated via an interpolation process. In this manner, an interpolation process may be applied to each of the randomly selected measurement locations of step 304 in order to generate a set of approximated TIS values for the locations not included in the randomly generated sub-sampling schemes. For example, for each of the randomly generated sub-sampling schemes, an interpolation process may be utilized to calculate TIS at non-sampled locations (i.e., locations not selected by random selection of step 304) utilizing the TIS values obtained from the randomly selected field locations of step 304.

In one embodiment, the interpolation process may include, but is not limited to, Spline interpolation, polynomial interpolation, wavelet interpolation or a neural network interpolation process. In a general sense, any interpolation algorithm which is applied to a set of input values to calculate or model a set of output values may be implemented in the present invention.

Examples of modeling used within the context of semiconductor metrology systems are generally described in U.S. Pat. Nos. 6,704,661; 6,768,967; 6,867,866; 6,898,596; 6,919,964; 7,069,153; 7,145,664; 7,873,585; and U.S. patent application Ser. No. 12/486,830; all of which are incorporated herein by reference.

In a fifth step 310, a preferred (or "selected") sub-sampling scheme may be determined by comparing the TIS values measured in the omniscient sampling process of step 302 to each of the sets of sub-sampling schemes formed using the combination of sub-sampling and interpolation.

In one embodiment, the comparison between the omniscient sampling and the sets of measurements using the sub-sampling schemes may include selecting a sub-sampling scheme which is configured to provide a difference between the TIS of the omniscient sampling process and the TIS of the sub-sampling/interpolation process of step 308 below a preselected level.

In another embodiment, the comparison between the omniscient sampling and the sets of measurements using the sub-sampling schemes may include selecting the sub-sampling scheme which best minimizes the difference between the omniscient TIS sampling and the sets of TIS measurements using the sub-sampling schemes. In this manner, the sampling scheme which best minimizes the difference between the omniscient TIS sampling and the sets of TIS measurements using the sub-sampling schemes is the preferred sampling scheme.

In one embodiment, the preferred sub-sampling scheme may include an optimal sampling scheme. For example, upon comparing the omniscient sampling and the sets of measurements using the sub-sampling schemes an optimal sampling scheme may be found by determining the optimal set of measurement locations of the wafer. As such, the sub-sampling scheme may include a determined number of measurement locations and locations of the determined number of measurement locations. The optimal sampling scheme in a general sense is the sub-set sampling conditions (e.g., location and number of measurement locations) which best minimizes the difference between measured TIS and approximated TIS across the wafer. It should be recognized by those skilled in the art that optimization of a sub-set sampling scheme may be accomplished using a known technique, including, but not limited to, the D-Optimal method and Federov exchange algorithms.

In another embodiment, the preferred sub-sampling scheme may include an enhanced sampling scheme. In a general sense, an enhanced sampling scheme allows for higher sampling rate than the optimized sampling scheme. In another embodiment, the preferred sub-sampling scheme may include a reduced sampling scheme. In a general sense, reduced sampling scheme provides for a lower sampling rate than the optimized sampling scheme. Optimal, enhanced, and reduced sub-sampling schemes are generally described in U.S. patent application Ser. No. 12/107,346, filed on Apr. 22, 2008, which is incorporated herein by reference.

It should be recognized that a determined optimal sub-sampling scheme is not a requirement of the present invention. Rather, only an adequate sub-sampling scheme need be determined for implementation in the present invention. For example, a set level of accuracy may be required in one context of the present invention and the method, therefore, need only provide a sub-sampling scheme which reduces the difference between the measured TIS of the omniscient sampling and the modeled TIS to a value below this selected level.

It should be further recognized that one or more sub-sampling plans may be generated in any suitable format. For instance, the file format may be configured such that it may be used by any measurement system or process tool known in the art.

In a further step 312, a subsequent TIS measurement on at least one wafer of a subsequent lot of wafers at each of the set of measurement locations of the sub-sampling scheme generated in step 310. In one aspect, the set of measurement locations may include the sub-set of fields of the wafer and the sub-set of measurement locations within each field of the wafer. The TIS measurements performed on one or more wafers of a subsequent lot may include TIS measurements similar to the measurements carried out in step 302. In this manner, the various measurements and methods of measurements as outlined in step 302 may be applied to the measurement locations (e.g., the selected fields and measurement locations within each field) supplied to the measurement system via the preferred sub-sampling scheme.

In a further step 314, TIS may be approximated for each of the non-measured measurement locations of the at least one wafer of the subsequent lot not included in the preferred sub-sampling scheme utilizing an interpolation process. In one aspect, the interpolation process may use as inputs the measure TIS for each of the measurement locations the preferred sub-sampling scheme. The interpolation processes used to approximate the correctables of the fields not included in the sub-sampling scheme are similar to the interpolation process outlined in step 308.

It is further contemplated that the TIS values calculated in step 314, which include the TIS measurements of locations within the preferred sub-sampling scheme, and the TIS values approximated in step 314, which include TIS values approximated by interpolating across the measurement locations not included in the preferred sub-sampling scheme (using the sampled locations as inputs), may be combined into one table. The single correctable table may be collected in any convenient computer file format.

In a further embodiment, the interpolation process of step 314 may implement a trainable history algorithm configured to incorporate information from previous interpolation process. For instance, information from a wafer previously processed (e.g., wafer in same lot or wafer in a different lot) by the system 200 may be utilized during the interpolation process of a current wafer. In this regard, the history algorithm may be utilized to determine constraints existent in previously process wafers. For example, the history algorithm may utilize information relating to the spatial dependence of TIS across a previously processed wafer to improve the interpolation process of a current wafer. For instance, information relating to the radial dependence or global or local maxima/minima and the like of a previously processed wafer may be utilized to constrain the dependence of a currently processed wafer.

In an additional step (not shown), following a subsequent TIS measurement on a wafer of a subsequent lot of wafers at one or more measurement locations of the set of measurement locations of the generated selected sub-sampling scheme, an average of two or more TIS values obtained from the one or more measurement locations may be calculated. Then, the averaged two or more TIS values may be assigned to all of the one or more measurement locations. For example, this process may be utilized to perform spatial averaging of TIS across the semiconductor surface. This may be particularly advantageous when TIS of a given wafer has (or is expected to have) relatively low variability across a portion of the wafer. In this manner, spatial averaging may be used to spatially average TIS values, which may be used to increase throughput.

Figure 5:
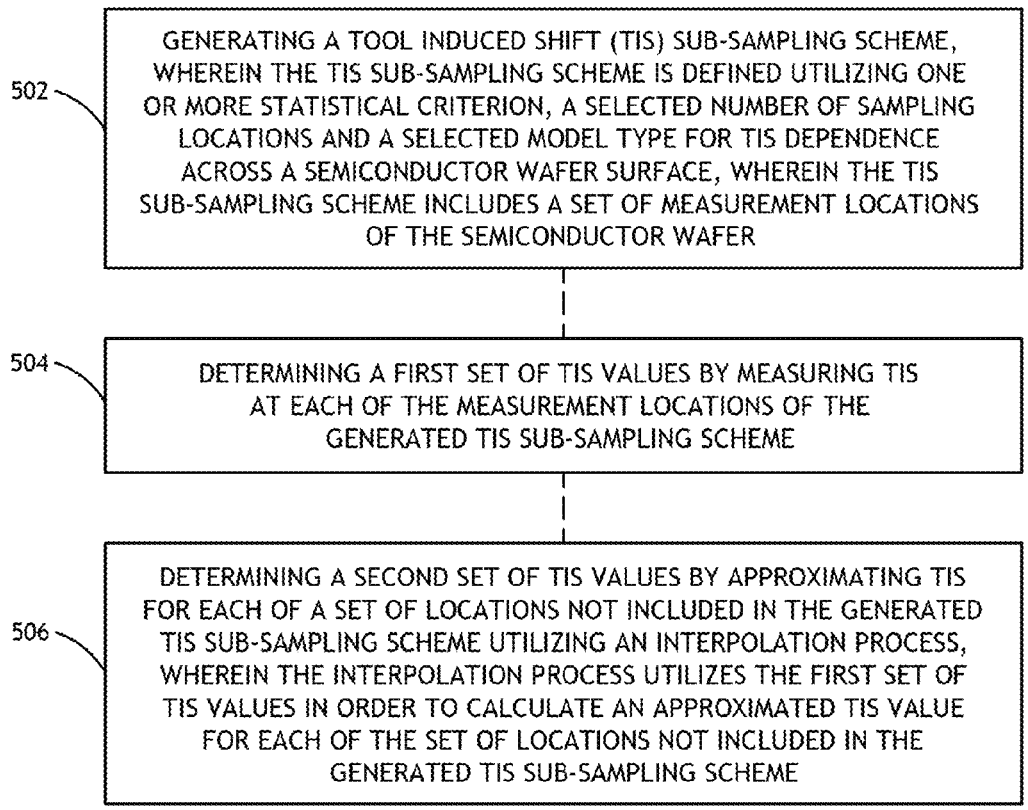
FIG. 5 is a flow diagram illustrating a method for providing tool induced shift values across a semiconductor surface, in accordance with one embodiment of the present invention.

It is further contemplated that the single correctable table described above may then be transmitted to one or more measurement tools or process tools to provide corrections to these and associated systems FIG. 5 is a flow diagram illustrating steps performed in an alternate method for providing tool induced values across a semiconductor surface using a sub-sampling sampling scheme with smart interpolation. In one aspect, it is recognized that data processing steps of the process flow 500 may be carried out via a pre-programmed algorithm executed by one or more processors of computer system 206 of the system 200. It should, however, be recognized by those skilled in the art, that the system 200 should not be interpreted as a limitation on process 500 as it is contemplated that a variety of system configurations may carry out process flow 500.

In a first step 502, a tool induced shift (TIS) sub-sampling scheme may be generated. In one aspect, a user may input the number (N) of measurement locations of the sub-sampling scheme into the system 200. In another aspect, the user may input the type of model utilized to model TIS across the wafer and/or fields of the wafer. For example, the user may select a systematic polynomial based TIS model for TIS across the wafer and/or field.

In another aspect, the TIS sub-sampling scheme is defined by one or more statistical criterion, the inputted N number of measurement locations, and the inputted TIS model type. In this regard, the system 200 may determine the optimal TIS sub-sampling scheme utilizing these inputs. For instance, the user may input a selected statistical criterion with which the system 200 may use to optimize or nearly optimize the TIS sub-sampling scheme. For example, the selected statistical criterion may include, but is not limited to, A-optimality, B-optimality, D-optimality, G-optimality, I-optimality, V-optimality, or the like. Those skilled in the art will recognize a variety of statistical criterion may be utilized to optimize the TIS sub-sampling scheme of the present invention. The principles of design optimization, which may be applied to the optimization of the TIS sub-sampling scheme, are generally described in Stephen Boyd and Lieven Vandenberghe, *Convex Optimization,* 7th printing, Cambridge University Press, 2009, which is incorporated herein by reference.

In one embodiment, the TIS sub-sampling scheme of step 502 may consist of an optimal sampling scheme. In another embodiment, the TIS sub-sampling scheme may include an enhanced sampling scheme. In another embodiment, the preferred sub-sampling scheme may include a reduced sampling scheme. Optimal, enhanced, and reduced sub-sampling schemes are generally described in U.S. patent application Ser. No. 12/107,346, filed on Apr. 22, 2008, which are incorporated above by reference.

As in process 300, It should be recognized that an optimal sub-sampling scheme is not a requirement of the present invention. Rather, only an adequate sub-sampling scheme need be determined for implementation in the present invention. For example, a set level of accuracy may be required in one context of the present invention and the method, therefore, need only provide a sub-sampling scheme which provides a level of accuracy required given the inputted number of sampling locations. It is anticipated that in a general sense many of the determined sub-sampling schemes of step 302 may be sub-optimal in nature.

In a second step 504, a first set of TIS values may be determined by measuring TIS at each of the measurement locations of the TIS sub-sampling scheme of step 502. In a general sense, the TIS measurement process of process 300 described previously herein may extend to step 504.

In a third step 506, a second set of TIS values may be determined by approximating TIS for each of the locations not included in the TIS sub-sampling scheme of step 502 utilizing an interpolation process. In one aspect, the interpolation process uses as an input the TIS values measured at each of the locations of the sub-sampling scheme of step 502. As in process 300, the interpolation process may include, but is not limited to, Spline interpolation, polynomial interpolation, wavelet interpolation or a neural network interpolation process. In a general sense, the interpolation process included in process 300 described previously herein may extend to step 506.

In a general sense, the various embodiments of process 300 should be interpreted to extend to process 500 unless otherwise noted.

Figure 6:
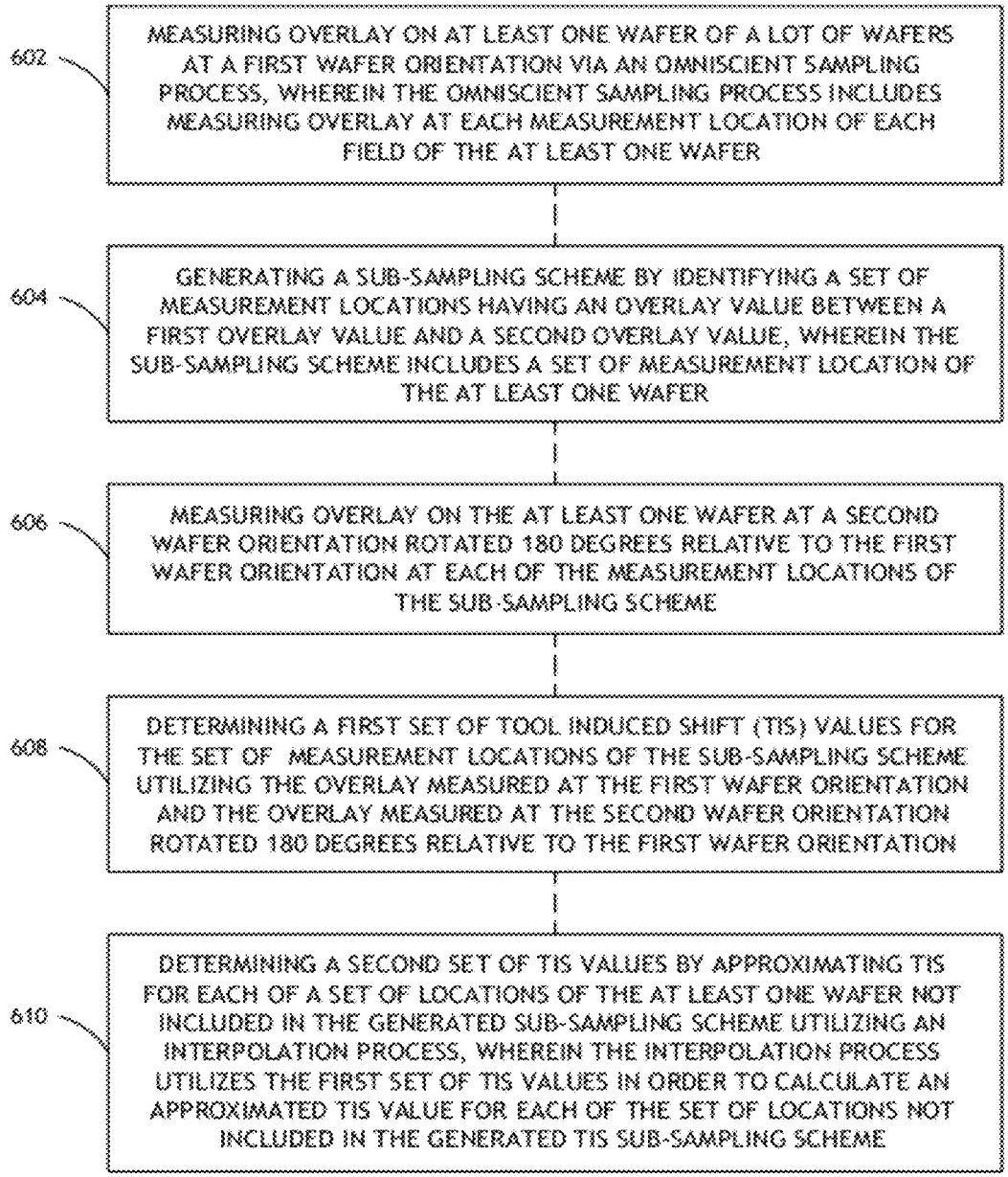
FIG. 6 is a flow diagram illustrating a method for providing tool induced shift values across a semiconductor surface, in accordance with one embodiment of the present invention.

FIG. 6 is a flow diagram illustrating steps performed in an alternate method for providing tool induced values across a semiconductor surface using a sub-sampling sampling scheme with smart interpolation. In one aspect, it is recognized that data processing steps of the process flow 600 may be carried out via a pre-programmed algorithm executed by one or more processors of computer system 206. It should, however, be recognized by those skilled in the art, that the system 200 should not be interpreted as a limitation on process 600 as it is contemplated that a variety of system configurations may carry out process flow 600.

In step 602, an overlay measurement may be performed at a first wafer orientation on at least a first wafer of a first lot of wafers using an omniscient sampling process. The omniscient sampling process may include measuring one or more overlay error values at each measurement location of the first wafer of the lot of wafers at a first wafer orientation. For example, the first wafer orientation may for the purposes of this disclosure be referred to as "zero degree orientation." For instance, the omniscient sampling process may include measuring overlay error at zero degree orientation at each measurement location of each field of the first wafer of the first lot of wafers. It should be recognized that the omniscient sampling process is similar to the omniscient sampling process described above in process flow 300. As such, the description of the omniscient sampling of process 300 should be interpreted to extend to the present process step 602. For example, as shown in FIG. 1A, the omniscient overlay error sampling process may measure overlay at all of the fields.

In step 604, a sub-sampling scheme may be generated by identifying the set of measurement locations having an overlay between a first overlay value and a second overlay value. In one embodiment, the sub-sampling scheme may be generated by identifying the set of measurement locations having an overlay value between a first overlay value and the maximum overlay value of the set of measured overlay values of the wafer. In this sense, the set of measurement locations displaying the largest overlay values of the set of measured overlay values of the wafer in the omniscient sampling process may be identified. These identified measurement locations may then serve as the locations of the sub-sampling scheme.

In another embodiment, the sub-sampling scheme may be generated by identifying the set of measurement locations having an overlay value between a first overlay value and a minimum overlay value of the set of measured overlay values of the wafer. In this sense, the set of measurement locations displaying the smallest overlay values of the set of measured overlay values of the wafer in the omniscient sampling process may be identified. These identified measurement locations may then serve as the locations of the sub-sampling scheme.

In another embodiment, the sub-sampling scheme may be generated by identifying the set of measurement locations having an overlay value between a first overlay value and a second overlay value. For example, the system 200 may select the N measurement locations within a standard deviation of the median overlay error value of the measured overlay measured in the omniscient sampling process. In another example, the system 200 may select the N measurement locations within three standard deviations of the median overlay error value of the measured overlay measured in the omniscient sampling process.

In another embodiment, the number (N) of measurement locations of the sub-sampling scheme may be selected by a user. In this sense, the system 200 may select the N locations displaying the largest overlay to be utilized in the sub-sampling scheme. Alternatively, the system 200 may select the N locations displaying the smallest overlay to be utilized in the sub-sampling scheme. In addition, the system 200 may select N locations within a range of overlay values to be utilized in the sub-sampling scheme.

In another embodiment, the critical metric utilized for determining the sub-sampling scheme may be selected by a user. For example, the system 200 may selected whether the sub-sampling scheme is generating using the N locations displaying the largest overlay, the N locations displaying the smallest overlay, of the N locations displaying overlay between a first and second value.

In step 606, overlay error may be measured at a second wafer orientation rotated 180 degrees relative to the first wafer orientation at each of the measurement locations of the sub-sampling scheme of step 604. It should be recognized that the measurement of overlay at 180 degrees is similar to the measurement of overlay at zero degrees (i.e., first rotational position of sample). As such, the description above related to the measurement of overlay at zero degrees should be interpreted to extend to step 606.

In step 608, a first set of TIS values for the set of measurement locations of the sub-sampling scheme may be determined utilizing the overlay measurements taken at 180 degrees and the overlay for the same locations measured at zero degrees. In this manner, the system 200 may apply an algorithm consistent with Eq. 1 of the present disclosure and calculate a TIS value for each of the measurement locations of the sub-sampling scheme.

In step 610, a second set of TIS values may be determined by approximating TIS for each of the set of measurement locations of the wafer not included in the sub-sampling scheme generate in step 604 utilizing an interpolation process. It is recognized herein that the interpolation process of step 610 is similar to the interpolation process described previously herein. As such, the description of interpolation processes described above should be interpreted to apply to step 610.

FIG. 7 is a flow diagram illustrating steps performed in an alternate method for providing tool induced values across a semiconductor surface using a sub-sampling sampling scheme with smart interpolation. In one aspect, it is recognized that data processing steps of the process flow 700 may be carried out via a pre-programmed algorithm executed by one or more processors of computer system 206. It should, however, be recognized by those skilled in the art, that the system 200 should not be interpreted as a limitation on process 700 as it is contemplated that a variety of system configurations may carry out process flow 700.

In step 702, an overlay measurement may be performed at a first wafer orientation on at least a first wafer of a first lot of wafers using an omniscient sampling process. It should be recognized that the omniscient sampling process is similar to the omniscient sampling process described above in process flow 600. As such, the description of the omniscient sampling of process 600 should be interpreted to extend to the present process step 702.

In step 704, a first set of process may be generated utilizing one or more results of the overlay measured via the omniscient sampling process of step 702. In one aspect, the first set of process tool correctables may include a process tool correctable calculated for each measurement location of each field of the at least one wafer. Further, a process tool correctable may be calculated for each of the measurement locations of the wafer. For instance, a process tool correctable of a given analyzed measurement location may be calculated using the measured overlay of all measurement locations of the at least one wafer. In this sense, step 704 acts to generate a set of process tool correctables based on overlay error values obtained from all measurement locations of the wafer.

In one embodiment, overlay or CD metrology data may be used to calculate an overlay correctable, a dose correctable, or a focus correctable for each field of the measured wafer. These correctable values may then be sent to a lithography tool to improve the lithography tools performance. In a general sense, the correctable data may be used to correct the alignment of a lithography tool (e.g., stepper) or scanner tool to improve the control of subsequent lithographic patterning with respect to overlay performance.

Traditionally, overlay errors taken from the fields of a wafer may be used to determine a linear overlay function. This linear overlay function may then be used as correctables for an associated process tool, such as a scanner or stepper tool. In addition to linear overlay functions, a high-order nonlinear overlay function may be implemented as an overlay function to calculate the corresponding correctables for a given process tool. For example, an analyzer (e.g., KLA-Tencor's KT Analyzer) may be configured to implement higher order models, which may then be used to input overlay and CD metrology data to calculate correctables on a field-by-field basis across a wafer. The intrafield correctables may include, but are not limited to, overlay correctables, focus correctable, and dose correctables. The associated table of intrafield correctables produced for each field of the measured wafer may include any correctable value known in the art.

Overlay functions used in calculation of process tool correctables are described generally in U.S. Pat. No. 7,876,438, issued on Jan. 25, 2011, and is incorporated herein by reference.

In step 706, a second set of process may be generated utilizing one or more results of the overlay measured via the omniscient sampling process. In one aspect, the second set of process tool correctables may include a process tool correctable calculated for each measurement location of each field of the at least one wafer. Further, a process tool correctable may be calculated for each of the measurement locations of the wafer. For instance, a process tool correctable calculated for a given analyzed measurement location may be calculated using the measured overlay of all measurement locations of the at least one wafer except for the analyzed measurement location.

In step 708, a sub-sampling scheme may be generated by comparing the first set of process tool correctables (generated in step 704) to the second set of process tool correctables (generated in step 706). In one aspect, the sub-sampling scheme, as previously described above, may include a selected number (N) of measurement locations, wherein the number of locations is selectable by a user. In a further aspect, the N measurement locations displaying the largest difference between the first set of process tool correctable and the second set of process tool correctables form the measurement locations of the sub-sampling scheme.

It contemplated herein that the measurement locations displaying the largest difference between the first set of process tool correctable and the second set of process tool correctables make up the set of measurement locations displaying the largest impact of the corrections. In this manner, by focusing on the N number of measurement locations having the largest impact on the process tool correctables the system 200 may more efficiently sample wafers as time is not wasted on analyzing measurement locations with little or no impact on the process tool correctables.

In step 710, overlay error may be measured at a second wafer orientation rotated 180 degrees relative to the first wafer orientation at each of the measurement locations of the sub-sampling scheme of step 708. It should be recognized that the measurement of overlay at 180 degrees is similar to the measurement of overlay at zero degrees (i.e., first rotational position of sample). As such, the description above related to the measurement of overlay at zero degrees should be interpreted to extend to step 710.

In step 712, a first set of TIS values for the set of measurement locations of the sub-sampling scheme may be determined utilizing the overlay measurements taken at 180 degrees and the overlay for the same locations measured at zero degrees. In this manner, the system 200 may apply an algorithm consistent with Eq. 1 of the present disclosure and calculate a TIS value for each of the measurement locations of the sub-sampling scheme.

In step 714, a second set of TIS values may be determined by approximating TIS for each of the set of measurement locations of the wafer not included in the sub-sampling scheme generated in step 708 utilizing an interpolation process. It is recognized herein that the interpolation process of step 714 is similar to the interpolation process described previously herein. As such, the description of interpolation processes described above should be interpreted to apply to step 714.

It is contemplated herein that the above process flow 700 may be implemented in a manner to determine a sub-sampling scheme consisting of the measurement locations having the largest on impact on additional overlay metrics, such as, but not limited to, overlay residuals or maximum predicted overlay. It is further contemplated herein that the sub-sampling scheme may consist of the measurement locations having the largest impact on a combination of overlay metrics, such as, but not limited to, process tool correctables, residuals, or maximum predicted overlay.

All of the methods described herein may include storing results of one or more steps of the method embodiments in a storage medium. The results may include any of the results described herein and may be stored in any manner known in the art. The storage medium may include any storage medium described herein or any other suitable storage medium known in the art. After the results have been stored, the results can be accessed in the storage medium and used by any of the method or system embodiments described herein, formatted for display to a user, used by another software module, method, or system, etc. For example, after the method generates the sub-sampling scheme, the method may include storing the sub-sampling scheme in a metrology recipe in a storage medium. In addition, results or output of the embodiments described herein may be stored and accessed by a metrology system such as a CD SEM such that a metrology system can use the sub-sampling scheme for metrology assuming that the output file can be understood by the metrology system. Furthermore, the results may be stored "permanently," "semi-permanently," temporarily, or for some period of time. For example, the storage medium may be random access memory (RAM), and the results may not necessarily persist indefinitely in the storage medium.

It is further contemplated that each of the embodiments of the method described above may include any other step(s) of any other method(s) described herein. In addition, each of the embodiments of the method described above may be performed by any of the systems described herein.

Those having skill in the art will recognize that the state of the art has progressed to the point where there is little distinction left between hardware and software implementations of aspects of systems; the use of hardware or software is generally (but not always, in that in certain contexts the choice between hardware and software can become significant) a design choice representing cost vs. efficiency tradeoffs. Those having skill in the art will appreciate that there are various vehicles by which processes and/or systems and/or other technologies described herein can be effected (e.g., hardware, software, and/or firmware), and that the preferred vehicle will vary with the context in which the processes and/or systems and/or other technologies are deployed. For example, if an implementer determines that speed and accuracy are paramount, the implementer may opt for a mainly hardware and/or firmware vehicle; alternatively, if flexibility is paramount, the implementer may opt for a mainly software implementation; or, yet again alternatively, the implementer may opt for some combination of hardware, software, and/or firmware. Hence, there are several possible vehicles by which the processes and/or devices and/or other technologies described herein may be effected, none of which is inherently superior to the other in that any vehicle to be utilized is a choice dependent upon the context in which the vehicle will be deployed and the specific concerns (e.g., speed, flexibility, or predictability) of the implementer, any of which may vary. Those skilled in the art will recognize that optical aspects of implementations will typically employ optically-oriented hardware, software, and or firmware.

Those skilled in the art will recognize that it is common within the art to describe devices and/or processes in the fashion set forth herein, and thereafter use engineering practices to integrate such described devices and/or processes into data processing systems. That is, at least a portion of the devices and/or processes described herein can be integrated into a data processing system via a reasonable amount of experimentation. Those having skill in the art will recognize that a typical data processing system generally includes one or more of a system unit housing, a video display device, a memory such as volatile and non-volatile memory, processors such as microprocessors and digital signal processors, computational entities such as operating systems, drivers, graphical user interfaces, and applications programs, one or more interaction devices, such as a touch pad or screen, and/or control systems including feedback loops and control motors (e.g., feedback for sensing position and/or velocity; control motors for moving and/or adjusting components and/or quantities). A typical data processing system may be implemented utilizing any suitable commercially available components, such as those typically found in data computing/communication and/or network computing/communication systems.

The herein described subject matter sometimes illustrates different components contained within, or connected with, different other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected", or "operably coupled", to each other to achieve the desired functionality, and any two components capable of being so associated can also be viewed as being "operably couplable", to each other to achieve the desired functionality. Specific examples of operably couplable include but are not limited to physically mateable and/or physically interacting components and/or wirelessly interactable and/or wirelessly interacting components and/or logically interacting and/or logically interactable components.

While particular aspects of the present subject matter described herein have been shown and described, it will be apparent to those skilled in the art that, based upon the teachings herein, changes and modifications may be made without departing from the subject matter described herein and its broader aspects and, therefore, the appended claims are to encompass within their scope all such changes and modifications as are within the true spirit and scope of the subject matter described herein.

Although particular embodiments of this invention have been illustrated, it is apparent that various modifications and embodiments of the invention may be made by those skilled in the art without departing from the scope and spirit of the foregoing disclosure. Accordingly, the scope of the invention should be limited only by the claims appended hereto.

It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes.

What is claimed:

1. A system for providing tool induced shift values across a semiconductor surface, comprising:
    an overlay metrology tool configured to measure tool induced shift (TIS) on at least one wafer of a lot of wafers via a full sampling process, wherein the full sampling process includes measuring TIS at each measurement location of each field of the at least one wafer;
    one or more processors communicatively coupled to the overlay metrology tool, wherein the one or more processors are configured to execute a set of program instructions configured to cause the one or more processors to execute the steps of:

randomly generating a plurality of sub-sampling schemes, wherein the number of fields to be sampled in each of the sub-sampling schemes is preselected, each of the set of randomly generated sub-sampling schemes having the same number of sampled fields, the number of sub-sampling schemes being preselected;

directing the overlay metrology tool to measure TIS at each location of each of the randomly generated sub-sampling schemes;

approximating a set of TIS values for each of the randomly generated sub-sampling schemes utilizing the TIS measurements from each of the randomly generated sub-sampling schemes, wherein each set of TIS values for each of the randomly generated sub-sampling schemes is calculated utilizing an interpolation process configured to approximate a TIS value for each location not included in a randomly generated sub-sampling scheme utilizing the TIS measured at each location of the randomly generated sub-sampling scheme;

identifying a preferred sub-sampling scheme, wherein the preferred sub-sampling scheme is the sub-sampling scheme of the plurality of randomly generated sub-sampling schemes that minimizes the difference between the calculated sets of TIS values and the measured TIS values of the full sampling process;

directing the overlay metrology tool to perform a TIS measurement according to the preferred sub-sampling scheme on at least one wafer of the lot of wafers via a full sampling process; and providing a set of process tool correctables for use in a process tool, wherein the set of process tool correctables are calculated based on the TIS measurement performed according to the preferred sub-sampling scheme.

2. The system of claim 1 wherein the one or more processors are further configured to execute the steps of:

performing a subsequent TIS measurement with the overlay metrology tool on at least one wafer of a subsequent lot of wafers at each of the set of measurement locations of the generated selected sub-sampling scheme; and approximating a TIS value for each of a set of measurement locations not included in the generated selected sub-sampling scheme of the at least one wafer of the subsequent lot of wafers utilizing one or more interpolation processes.

3. The system of claim 2, wherein the approximating a TIS value for each of a set of measurement locations not included in the generated selected sub-sampling scheme of the at least one wafer of the subsequent lot of wafers utilizing one or more interpolation processes comprises:

approximating a TIS value for each of a set of measurement locations not included in the generated selected sub-sampling scheme of the at least one wafer of the subsequent lot of wafers utilizing one or more interpolation processes, wherein a portion of the one or more interpolation processes utilize a trainable history algorithm configured to incorporate information from previous interpolation processes.

4. The system of claim 1, wherein the one or more processors are further configured to execute the steps of:

directing the overlay metrology tool to perform a subsequent TIS measurement on at least one wafer of a subsequent lot of wafers at one or more measurement locations of the set of measurement locations of the generated selected sub-sampling scheme;

calculating an average of two or more TIS values obtained from the one or more measurement locations of the set of measurement locations of the generated sub-sampling scheme; and assigning the averaged two or more TIS values to all of the one or more measurement locations of the set of measurement locations of the generated selected sub-sampling scheme.

5. The system of claim 1, wherein the generating a selected sub-sampling scheme by comparing each of the calculated sets of TIS values to the measured TIS of the full sampling process, wherein the sub-sampling scheme includes a set of measurement locations of the at least one wafer comprises:

generating a selected sub-sampling scheme by calculating a difference between each of the calculated sets of TIS values and the measured TIS of the full sampling process.

6. The system of claim 1, wherein the generating a selected sub-sampling scheme by comparing each of the calculated sets of TIS values to the measured TIS of the full sampling process, wherein the sub-sampling scheme includes a set of field locations of the at least one wafer and a set of measurement locations within each field of the at least one wafer comprises:

generating a selected sub-sampling scheme by calculating a difference between each of the calculated sets of TIS values and the measured TIS of the full sampling process, wherein the preferred sub-sampling scheme is configured to provide a difference between the measured TIS of the sampling process and the approximated TIS below a preselected level.

7. The system of claim 1, wherein the interpolation process includes at least one of Spline interpolation process, polynomial interpolation process, or neural network interpolation process.

8. The system of claim 1, wherein the plurality of sub-sampling schemes are randomly generated with a Monte Carlo analysis process.

9. A system for providing tool induced shift values across a semiconductor surface, comprising:

an overlay metrology tool;

one or more processors communicatively coupled to the overlay metrology tool, wherein the one or more processors are configured to execute a set of program instructions configured to cause the one or more processors to execute the steps of:

generating a tool induced shift (TIS) sub-sampling scheme, wherein the TIS sub-sampling scheme is defined utilizing one or more statistical criterion, a selected number of sampling locations and a selected model type for TIS dependence across a semiconductor wafer surface, wherein the TIS subsampling scheme includes a set of measurement locations of the semiconductor wafer;

determining a first set of TIS values by directing the overlay metrology tool to acquire TIS values, at each of the measurement locations of the generated TIS sub-sampling scheme; and determining a second set of TIS values by approximating TIS for each of a set of locations not included in the generated TIS sub-sampling scheme utilizing an interpolation process, wherein the interpolation process utilizes the first set of TIS values in order to calculate an approximated TIS value for each of the set of locations not included in the generated TIS sub-sampling scheme;

forming a full set of TIS values by combining the first set of TIS values and the second set of TIS values: and providing a set of process tool correctables based on the full set of TIS values.

10. The system of claim 9, wherein the generated TIS sub-sampling scheme includes a sub-set of available fields of a semiconductor wafer of a lot of wafers.

11. The system of claim 9, wherein the generated TIS sub-sampling scheme includes a sub-set of measurement locations of available measurement locations in each field of a semiconductor wafer of a lot of wafers.

12. The system of claim 9, wherein the number of sampling locations is selectable by a user.

13. The system of claim 9, wherein the model type for TIS dependence across a semiconductor wafer surface is selectable by a user.

14. The system of claim 9, wherein the generated TIS sub-sampling scheme includes at least one of an optimal sampling scheme, an enhanced sampling scheme, or a reduced sampling scheme.

15. The system of claim 9, wherein the interpolation process includes at least one of a Spline interpolation process, a polynomial interpolation process, or a neural network interpolation process, or a wavelet-based interpolation process.

16. A system for providing tool induced shift values across a semiconductor surface, comprising:

an overlay metrology tool configured to measure overlay on at least one wafer of a lot of wafers at a first wafer orientation via a full sampling process, wherein the full sampling process includes measuring overlay at each measurement location of each field of the at least one wafer;

one or more processors communicatively coupled to the overlay metrology tool, wherein the one or more processors are configured to execute a set of program instructions configured to cause the one or more processors to execute the steps of:

generating a sub-sampling scheme by identifying a set of measurement locations having an overlay value between a first overlay value and a second overlay value, wherein the sub-sampling scheme includes a set of measurement locations of the at least one wafer;

directing the overlay metrology tool to measure overlay on the at least one wafer at a second wafer orientation rotated 180 degrees relative to the first wafer orientation at each of the measurement locations of the sub-sampling scheme;

determining a first set of tool induced shift (TIS) values for the set of measurement locations of the sub-sampling scheme utilizing the overlay measured at the first wafer orientation and the overlay measured at the second wafer orientation rotated 180 degrees relative to the first wafer orientation; and determining a second set of TIS values by approximating TIS for each of a set of measurement locations of the at least one wafer not included in the generated sub-sampling scheme utilizing an interpolation process, wherein the interpolation process utilizes the first set of TIS values in order to calculate an approximated TIS value for each of the set of locations not included in the generated TIS sub-sampling scheme;

forming a full set of TIS values by combining the first set of TIS values and the second set of TIS values; and providing a set of process tool correctables based on the full set of TIS values.

17. The system of claim 16, wherein the interpolation process includes at least one of Spline interpolation process, polynomial interpolation process, or neural network interpolation process.

18. The system of claim 16, wherein the identifying a set of measurement locations having an overlay value between a first overlay value and a second overlay value comprises:

identifying a set of measurement locations having an overlay value between a first overlay value and a maximum overlay value, wherein the maximum overlay value is the maximum overlay value measured for the at least one wafer.

19. The system of claim 16, wherein the identifying a set of measurement locations having an overlay value between a first overlay value and a second overlay value comprises:

identifying a set of measurement locations having the largest overlay values of the measurement locations measured in the full sampling process, wherein the set of measurement locations having the largest overlay values includes a selected number of measurement locations.

20. The system of claim 16, wherein the identifying a set of measurement locations having an overlay value between a first overlay value and a second overlay value comprises:

identifying a set of measurement locations having an overlay value between a first overlay value and a minimum overlay value, wherein the minimum overlay value is the minimum overlay value measured for the at least one wafer.

21. The system of claim 16, wherein the identifying a set of measurement locations having an overlay value between a first overlay value and a second overlay value comprises:

identifying a set of measurement locations having the smallest overlay values of the measurement locations measured in the full sampling process, wherein the set of measurement locations having the smallest overlay values includes a selected number of measurement locations.

22. The system of claim 16, wherein the identifying a set of measurement locations having an overlay value between a first overlay value and a second overlay value comprises:

identifying a set of measurement locations having an overlay value between a first overlay value and a second overlay value, wherein the first overlay value and the second overlay values define a range of overlay values, wherein the range of overlay values includes a median overlay value.

23. A system for providing tool induced shift values across a semiconductor surface, comprising:

a overlay metrology tool configured to measure overlay on at least one wafer of a lot of wafers at a first wafer orientation via a full sampling process, wherein the full sampling process includes measuring overlay at each measurement location of each field of the at least one wafer;

one or more processors communicatively coupled to the TIS overlay metrology tool, wherein the one or more processors are configured to execute a set of program instructions configured to cause the one or more processors to execute the steps of:

generating a first set of process tool correctables utilizing one or more results of the overlay measured via the full sampling process, wherein the first set of process tool correctables includes a process tool correctable calculated for each measurement location of each field of the at least one wafer, wherein a process tool correctable of the first set of process tool correctables associated with an analyzed measurement location of the at least one wafer is calculated using the measured overlay of all measurement locations of the at least one wafer;

generating a second set of process tool correctables utilizing one or more results of the overlay measured via the full sampling process, wherein the second set of process tool correctables includes a process tool correctable calculated for each measurement location of each field of the at least one wafer, wherein a process tool correctable of the second set of process tool correctables associated with an analyzed measurement location of the at least one wafer is calculated using the measured overlay of all measurement locations of the at least one wafer except for the analyzed measurement location;

generating a sub-sampling scheme by comparing the first generated set of process tool correctables to the second generated set of process tool correctables, wherein the sub-sampling scheme includes a set of measurement locations, wherein the set of measurement locations of the sub-sampling scheme includes a selected number of sub-sampling measurement locations, wherein the selected number of measurement locations of the at least one wafer having the largest difference between the first generated set of process tool correctables and the second generated set of process tool correctables form the set of measurement locations of the sub-sampling scheme;

directing the overly metrology tool to measure overlay on the at least one wafer at a second wafer orientation rotated 180 degrees relative to the first wafer orientation at each of the measurement locations of the generated sub-sampling scheme;

determining a first set of tool induced shift (TIS) values for the set of sub-sampling measurement locations of the sub-sampling scheme utilizing the overlay measured at the first wafer orientation and the overlay measured at the second wafer orientation rotated 180 degrees relative to the first wafer orientation; and determining a second set of TIS values by approximating TIS for each of a set of locations of the at least one wafer not included in the generated sub-sampling scheme utilizing an interpolation process, wherein the interpolation process utilizes the first set of TIS values in order to calculate an approximated TIS value for each of the set of locations not included in the generated TIS sub-sampling scheme;

forming a full set of TIS values by combining the first set of TIS values and the second set of TIS values; and providing a set of process tool correctables based on the full set of TIS values.

* * * * *